United States Patent [19]

Fujisaki et al.

[11] 4,284,912
[45] Aug. 18, 1981

[54] SWITCHING CIRCUITS FOR DIFFERENTIAL AMPLIFIERS

[75] Inventors: Hitoshi Fujisaki; Hideo Onodera; Yasuhiro Toyomura, all of Kodaira, Japan

[73] Assignee: Hitachi Denshi K.K., Chiyoda, Japan

[21] Appl. No.: 90,147

[22] Filed: Nov. 1, 1979

[30] Foreign Application Priority Data

Nov. 9, 1978 [JP] Japan ................................. 53/137267
Mar. 15, 1979 [JP] Japan ................................. 54/29356

[51] Int. Cl.$^3$ ............................................. H03K 17/60
[52] U.S. Cl. ..................................... 307/255; 330/51; 330/254
[58] Field of Search ................... 307/255, 355; 328/96, 328/99, 100; 330/51, 252, 254

[56] References Cited

U.S. PATENT DOCUMENTS 3,737,797  6/1973  Amemiya ........................... 330/51 X Primary Examiner—James B. Mullins
Assistant Examiner—Gene Wan
Attorney, Agent, or Firm—Blakely, Sokoloff, Taylor & Zafman

[57] ABSTRACT

In a differential amplifier comprising first and second transistors of one conductivity type and having emitter electrodes commonly connected, a switching circuit is provided which includes third and fourth transistors of the opposite conductivity type. A switching signal is applied to the base electrodes of the third and fourth transistors, the emitter electrodes thereof are connected to the collector electrodes of the first and second transistors, and the collector electrodes of the third and fourth transistors are connected to the commonly connected emitter electrodes of the first and second transistors. A fifth transistor acting as a constant current source is connected to the commonly connected emitter electrodes of the first and second transistors. In a modified embodiment a sixth transistor is connected in parallel with the fifth transistor to prevent saturation of the third and fourth transistors acting as the switching transistors.

4 Claims, 3 Drawing Figures

SWITCHING CIRCUITS FOR DIFFERENTIAL AMPLIFIERS

BACKGROUND OF THE INVENTION

This invention generally relates to switching citcuits for differential amplifiers, and more particularly a switching circuit for a differential amplifier suitable for being manufactured through integrated circuit technique and having a small variation in the output offset and a small current variation.

One example of a prior art switching circuit of a differential amplifier is shown in FIG. 1. As shown, there are provided a pair of NPN transistors Q1 and Q2 with their emitter electrodes commonly connected, and an NPN transistor Q3 with its emitter electrode connected to ground through a resistor R1 for constituting a constant current source. Resistors R2 and R3 constitute load resistors of a differential amplifier constituted by transistors Q1 and Q2. The load resistors are connected, at one end, to the collector electrodes of the transistors Q1 and Q2, while they are commonly connected, at the other end, to a source $V_{cc}$. Characters IN1 and IN2 designate input terminals to which input signals are applied, OUT1 and OUT2 designate output terminals and CT a terminal to which a switching signal is applied.

With the switching circuit for the differential amplifier described above, when a switching signal is supplied to the base electrode of the transistor Q3 that constitute the constant current source, transistors Q1 and Q2 that comprise the differential amplifier are respectively switched to produce a switched output signal from their collector electrodes corresponding to the switching signal.

With this switching circuit, however, when the transistors Q1 and Q2 are cut off by the switching signal, their collector voltage rises to the voltage of the source $V_{cc}$ which not only affects succeeding circuits but also produces transient noise. Moreover, variation in the current caused by the switching is large which gives a switching noise to a circuit connected to the output OUT1 or OUT2 through a line impedance. Furthermore, when the transistors Q1 and Q2 are cut off, the collector impedance of the differential amplifier increases thus causing leakage from the base electrodes.

SUMMARY OF THE INVENTION

It is an object of this invention to provide an improved switching circuit for a transistor differential amplifier capable of eliminating the defects described above.

Another object of this invention is to provide an improved switching circuit for transistor differential amplifier capable of preventing saturation of switching transistors.

According to this invention, there is provided a switching circuit for a differential amplifier including first and second transistors of one conductivity type with their emitter electrodes commonly connected, said switching circuit comprising third and fourth switching transistors having a conductivity type opposite to that of the first and second transistors, the base electrodes of the third and fourth transistors being connected commonly; means for connecting the collector electrodes of the third and fourth transistors to the commonly connected emitter electrodes of the first and second transistors; means for connecting the collector electrodes of the first and second transistors to the emitter electrodes of the third and fourth transistors respectively; and means for applying a switching signal to the base electrodes of the third and fourth transistors so as to switch the output signals produced by the first and second transistors.

The commonly connected emitter electrodes of the first and second transistors are connected to a fifth transistor acting as a source of constant current. In a modified embodiment, a sixth transistor is connected in parallel with the fifth transistor for preventing saturation of the switching transistors.

DESCRIPTION OF THE PREFERRED EMBODIMENTS

Figure 1:
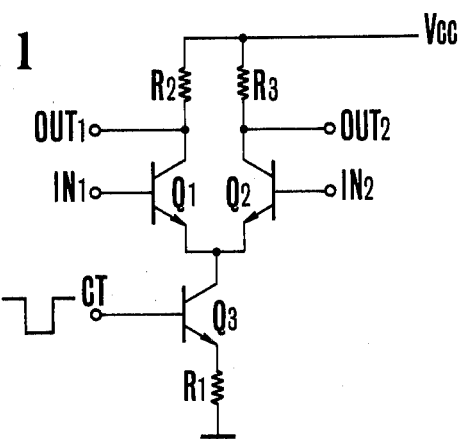
FIG. 1 is a connection diagram showing one example of a prior art switching circuit for a prior art transistor differential amplifier.
Figure 2:
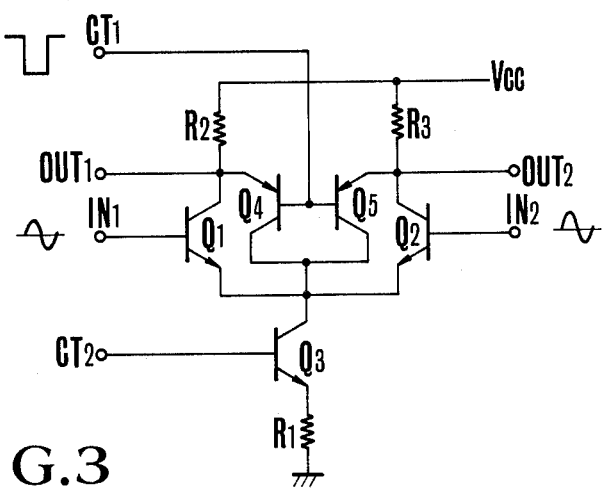
FIG. 2 is a connection diagram showing one embodiment of the switching circuit for a differential amplifier embodying the invention.

In a preferred embodiment of this invention shown in FIG. 2, circuit elements corresponding to those shown in FIG. 1 are designated by the same reference characters. There are added a pair of PNP switching transistors Q4 and Q5 and a switching signal is applied to the base electrodes of transistors Q4 and Q5 through an input terminal CT1. A constant current bias voltage is applied to the base electrode of transistor Q3 via a terminal CT2.

As before, the emitter electrodes of transistors Q1 and Q2 are commonly connected to the collector electrode of transistor Q3, and the collector electrodes of transistors Q1 and Q2 are connected to the output terminals OUT1 and OUT2, respectively, and to the source $V_{cc}$ via load resistors R2 and R3, respectively. The base electrodes of transistors Q1 and Q2 are connected to input terminals IN1 and IN2 supplied with input signals. The emitter electrode of transistor Q3 is connected to ground via resistor R1. The collector electrodes of transistors Q4 and Q5 are commonly connected to the commonly connected emitter electrodes of transistors Q1 and Q2 whereas the emitter electrodes of transistors Q4 and Q5 are connected to the collector electrodes of transistors Q1 and Q2, respectively. The circuit is constructed such that when a switching signal is applied to the base electrodes of transistors Q4 and Q5 through input terminal CT1, the collector output signals of transistors Q1 and Q2 that constitute a differential amplifier are switched. It will be noted that the constant current source may be constituted by transistor Q3 alone or resistor R1 alone.

The circuit shown in FIG. 2 operates as follows: During the normal operation, when a DC bias voltage equal to or higher than the voltage of the source $V_{cc}$ is applied to the base electrodes of the transistors Q4 and Q5, transistors Q1 and Q2 operate as an ordinary differential amplifier. More particularly, under these conditions, no base current flows through the transistors Q4 and Q5 so that it is possible to produce a differential output on output terminals OUT1 and OUT2 connected to the collector electrodes of two transistors Q1 and Q2 by applying independent input signals to the base electrodes of these transistors via input terminals IN1 and IN2. Since the differential output is proportional to the difference between the two input signals, it is possible to decrease as far as possible in-phase input signal components contained in the output and to obtain an output corresponding to the differential input signal component. When a sufficiently low DC bias voltage is applied to the base electrodes of the transistors Q4 and Q5 through the input terminal CT1 to act as a switching signal, the collector output signals of the transistors Q1 and Q2 that comprise the differential amplifier are clipped. When the clipped output signals are applied to the junction of the emitter electrodes of transistors Q1 and Q2, the currents flowing therethrough are cut off, thus cutting off the output signal. In other words, under these conditions, since base currents flow through transistors Q4 and Q5, their emitter-collector paths become conductive. Then, the collector output signals of the transistors Q1 and Q2 are clipped and supplied to the emitter electrodes of transistors Q1 and Q2 so that the current flowing therethrough are cut off.

By selecting to a suitable value the DC level supplied to the base electrodes of the switching transistors Q4 and Q5 at the time of cut off, it is possible to select any desired output DC offset of the differential amplifier at the time of cut off. Also, it is possible to make zero the output DC offset.

In the embodiment described above, although NPN type transistors were used as the transistors Q1 and Q2 which comprise the differential amplifier and PNP type transistors were used as the switching transistors Q4 and Q5, it is possible to use PNP type transistors as the transistors Q1 and Q2 and NPN type transistors as the switching transistors Q4 and Q5 in which case the polarity of the source should be reversed.

As described above, the invention makes it possible to construct, with lesser number of circuit elements, a switching circuit for a differential amplifier having a small output DC offset, a small current variation and a low output impedance at the time of turn off. Moreover, as it is possible to prevent increase of the collector voltages of the transistors comprising the differential amplifier, it is possible to prevent adverse effect upon succeeding circuits and generation of transient noise. Further, as the variation of current is small, it is possible to prevent to apply switching noise to another circuit, and the low output impedance at the time of turn off prevents leakage from the base electrodes. The circuit of this invention is suitable to fabricate with integrated circuit technique. For example, the circuit of this invention can be advantageously used to switch analogue signals produced by a color television camera.

Figure 3:
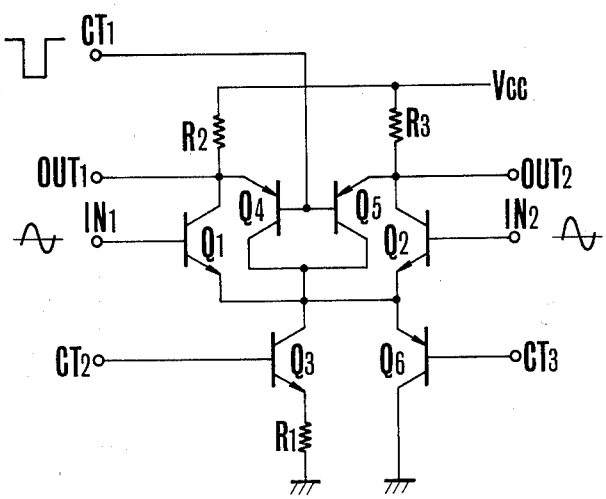
FIG. 3 is a connection diagram showing another embodiment of this invention.

The second embodiment of this invention shown in FIG. 3 is generally identical to the first embodiment shown in FIG. 2 except that a sixth transistor Q6 is connected in parallel with serially connected transistor Q3 and resistor R1 and a forward bias potential is applied to the base electrode of the sixth transistor Q6 through an input terminal CT3.

The reason for using the sixth transistor Q6 is as follows: More particularly, when the collector currents of the switching transistors become saturated, the turn-on time and the turn-off time of the collector current caused by the variation in the switching signal become large, thus decreasing the switching time. The collector-emitter path of the sixth transistor Q6 acting as a clipper is connected forwardly or in the same direction with respect to the collector-emitter paths of the transistors Q1 and Q2. The forward bias applied to the base electrode of the fifth transistor Q6 via input terminal CT3 determines the collector-emitter current of transistor Q6, thus preventing saturation of the switching transistors Q4 and Q5.

Furthermore, by applying a predetermined DC bias voltage applied to the base electrode of transistor Q6 at the time of cut off, it is possible to set to any value the output offset components appearing at the output terminals OUT1 and OUT2 at the time of cut off.

If desired the output offset component may be made zero.

What is claimed is:

1. A switching circuit for a differential amplifier including first and second transistors of one conductivity type with their emitter electrodes commonly connected; said switching circuit comprising third and fourth switching transistors having a conductivity type opposite to that of said first and second transistors, the base electrodes of said third and fourth transistors being connected commonly;
   means for connecting the collector electrodes of said third and fourth transistors to the commonly connected emitter electrodes of said first and second transistors;
   means for connecting the collector electrodes of said first and second transistors to the emitter electrodes of said third and fourth transistors respectively; and
   means for applying a switching signal to the base electrodes of said third and fourth transistors so as to switch the output signals produced by the first and second transistors.

2. A switching circuit according to claim 1 which further comprises a fifth transistor with its collector electrode connected to the commonly connected emitter electrodes of said first and second transistors and to the commonly connected collector electrodes of said third and fourth transistors, said fifth transistor acting as a constant current source.

3. A switching circuit according to claim 2 wherein a base electrode of said fifth transistor is connected to a terminal supplied with a constant current bias voltage and an emitter electrode of said fifth transistor is grounded through a resistor.

4. A switching circuit according to claim 2 or 3 which further comprises a sixth transistor connected in parallel with said fifth transistor for preventing saturation of said third and fourth transistors.

* * * * *